United States Patent [19]

Fabricius et al.

[11] Patent Number: 4,508,757

[45] Date of Patent: Apr. 2, 1985

[54] METHOD OF MANUFACTURING A MINIMUM BIRD'S BEAK RECESSED OXIDE ISOLATION STRUCTURE

[75] Inventors: Karen A. Fabricius, Newburgh; Bernard M. Kemlage, Kingston, both of N.Y.

[73] Assignee: International Business Machines Corporation, Armonk, N.Y.

[21] Appl. No.: 450,883

[22] Filed: Dec. 20, 1982

[51] Int. Cl.³ ............................................ H01L 21/76
[52] U.S. Cl. .................................. 427/93; 29/576 W; 156/662; 427/94; 427/95; 427/96
[58] Field of Search .................... 427/93, 94, 95, 96; 156/657, 662; 29/576 W

[56] References Cited

U.S. PATENT DOCUMENTS

| | | | |
|---|---|---|---|
| 3,534,234 | 12/1966 | Clevenger | 317/235 |
| 3,648,125 | 3/1972 | Peltzer | 317/235 |
| 3,900,350 | 8/1975 | Appels et al. | 427/94 |
| 3,970,486 | 7/1976 | Kooi | 148/187 |
| 4,373,248 | 2/1983 | McElroy | 29/576 B |
| 4,407,696 | 10/1983 | Han | 427/93 |
| 4,419,142 | 12/1983 | Matsukawa | 427/93 |

OTHER PUBLICATIONS

Matsunaga, "Selective Polysilicon Oxidation Technology for Defect Free Isolation"Conference: International Electron Devices Meeting, Technical Digest, Washington D.C., USA, Dec. 8-10, 1980.

*Primary Examiner*—John D. Smith
*Attorney, Agent, or Firm*—George O. Saile

[57] ABSTRACT

A method for making a monocrystalline integrated circuit structure is described. The monocrystalline silicon body is provided. There is formed thereon a layered structure of silicon dioxide, polycrystalline silicon and silicon nitride, in that order. The layers are patterned to form openings in the structure at the areas where it is desired to form an oxide isolation pattern within the monocrystalline silicon body. If it is desired to form a semi-recessed oxide isolation there will be no etching of the monocrystalline silicon body in the openings. Should it be desired to form a full recessed oxide isolation there is etching of the monocrystalline silicon to a desired depth to form a substantially planar top surface of the monocrystalline with the recessed dielectric oxide isolation. The body is then oxidized until the desired oxide isolation pattern penetrates to the desired depth within the silicon body.

9 Claims, 9 Drawing Figures

METHOD OF MANUFACTURING A MINIMUM BIRD'S BEAK RECESSED OXIDE ISOLATION STRUCTURE

DESCRIPTION

1. Technical Field

The invention relates to methods for manufacturing monolithic integrated circuit structures and more particularly to methods for dielectrically isolating regions of monocrystalline silicon from other regions of monocrystalline silicon.

2. Background Art

Recessed oxide isolation is currently used to isolate devices from one another and reduce wiring channel capacitances. There are two types of recessed oxide isolation, one is what is termed semi-recessed oxide isolation and the other full recessed oxide isolation. The semi-recessed oxide isolation method involves forming a mask pattern over the surface of a monocrystalline silicon body wherein the body is covered in areas which are designated as the device areas and open in the areas designated to be the recessed oxide isolation areas. The structure is then subjected to an oxidizing ambient and the monocrystalline silicon is oxidized in unmasked areas. The top surface of the resulting semi-recessed oxide isolation is higher in the areas of isolation than in the areas of the top surface of the monocrystalline silicon. Full recessed oxide isolation is utilized where it is desired to have the top surface of the isolation pattern substantially planar with the top surface of the monocrystalline silicon body. This is accomplished by the removal by etching of a portion of the monocrystalline silicon body in the areas designated to be oxidized. During this groove formation in the monocrystalline silicon, the remainder of the monocrystalline silicon surface which is protected by the protective mask pattern is substantially unaffected by the silicon etch used to form the grooves. The silicon body is then subjected to the oxidation step whereby the silicon in the groove area is oxidized and the silicon dioxide fills up the groove as well as oxidizing further into the silicon to form the isolation region whose top surface is substantially planar with the top surface of the monocrystalline silicon body.

The usual protective or mask layer is a silicon nitride, silicon dioxide layered structure. The silicon nitride is the top layer of the mask and acts to prevent the oxidation of the monocrystalline silicon designated device regions thereunder. The silicon dioxide layer is located between the silicon nitride layer and the monocrystalline silicon layer and acts as a stress buffering layer to keep the tensile stress of the silicon nitride from creating defects in the silicon. The presence of this silicon dioxide layer however, is detrimental because oxygen diffuses laterally along it during the recessed oxide isolation process and a "bird's beak" is formed. The "bird's beak" reduces device density and prevents the abutting of junctions to the dielectric recessed oxide isolation regions. This process is described more fully by E. Kooi U.S. Pat. No. 3,970,486, Clevenger U.S. Pat. No. 3,534,234, Peltzer U.S. Pat. No. 3,648,125 and I. Magdo et al. patent application Ser. No. 150,609 filed June 7, 1971.

J. A. Appels et al. U.S. Pat. No. 3,900,350 describes a method to overcome the "bird's beak" problem described above. This patent suggests the substitution of a layer of polycrystalline silicon for the silicon dioxide layer between the silicon nitride masking layer and the monocrystalline silicon body. The patent states that they had found that the progress of the silicon dioxide-silicon interface in polycrystalline silicon is not noticeably different from that in monocrystalline silicon as a result of which "beak formation" does not occur while mechanical stresses between silicon nitride and silicon do not result in the occurrence of excessive disturbances in the crystal lattice of the monocrystalline silicon. It was stated that these mechanical stresses are apparently neutralized by the polycrystalline silicon layer and that the polycrystalline silicon layer gives good satisfaction when using silicon nitride as a mask material against oxidation.

The above-described Appels et al's method, despite the contrary statements in the patent, has not been utilized because of the observation of defects at the monocrystalline silicon surface under the mask.

It is an object of this invention to provide a method which will reduce "beak formation" without the formation of defects underneath the masking layer in the monocrystalline silicon body.

It is a further object of this invention to provide a method for forming recessed oxide isolation wherein the mask utilized for this formation during the oxidation step is a layered structure of silicon dioxide, polycrystalline silicon and silicon nitride in that order on the monocrystalline silicon body wherein the process results in substantially less "beak formation" and no increase in defect formation under the mask layer.

SUMMARY OF THE PRESENT INVENTION

In accordance with the present invention a method for making a monocrystalline integrated circuit structure is described. The monocrystalline silicon body is provided. There is formed thereon a layered structure of silicon dioxide, polycrystalline silicon and silicon nitride, in that order. The layers are patterned to form openings in the structure at the areas where it is desired to form an oxide isolation pattern within the monocrystalline silicon body. If it is desired to form a semi-recessed oxide isolation there will be no etching of the monocrystalline silicon body in the openings. Should it be desired to form a full recessed oxide isolation there is etching of the monocrystaline silicon to a desired depth to form a substantially planar top surface of the monocrystalline with the recessed dielectric oxide isolation. The body is then oxidized until the desired oxide isolation pattern penetrates to the desired depth within the silicon body.

It is preferred that the layered structure have a thickness of the silicon dioxide of between about 2 to 10 nanometers, polycrystalline silicon of between about 5 to 500 nanometers and silicon nitride between about 10 to 500 nanometers. The silicon dioxide layer is preferably formed in a dry oxygen atmosphere at a temperature of from about 700° to 900° C. The polycrystalline silicon and the silicon nitride is preferably formed by means of low pressure chemical vapor deposition. The desired oxide isolation pattern is between about 300 to 3,000 nanometers in thickness.

DISCLOSURE OF THE INVENTION

Figure 1:
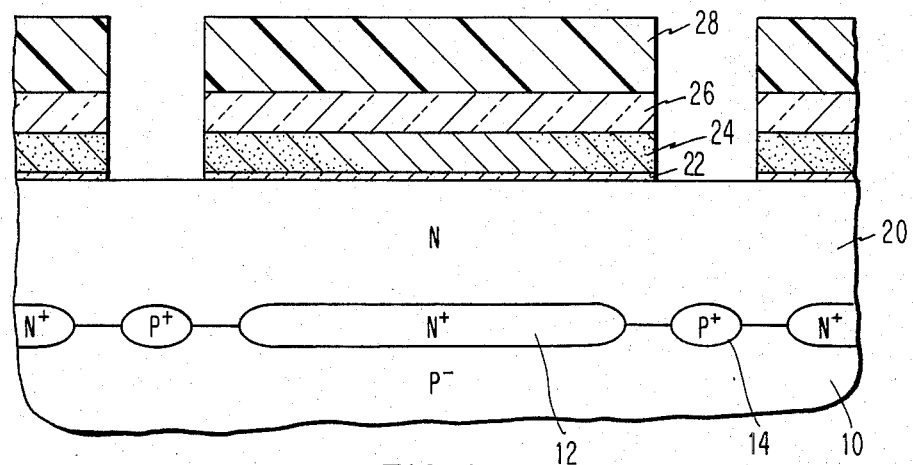
FIGS. 1 through 3 illustrate a first embodiment of the present process wherein a semi-recessed oxide isolation structure is formed.
Figure 2:
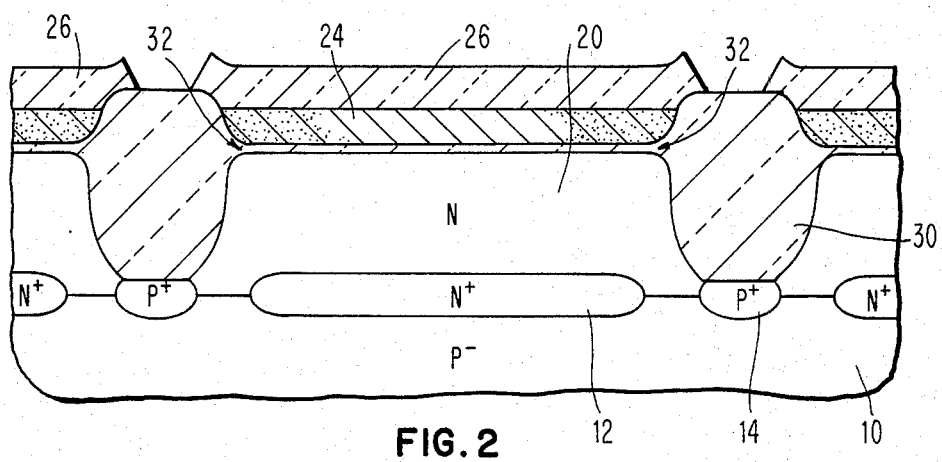
Figure 3:
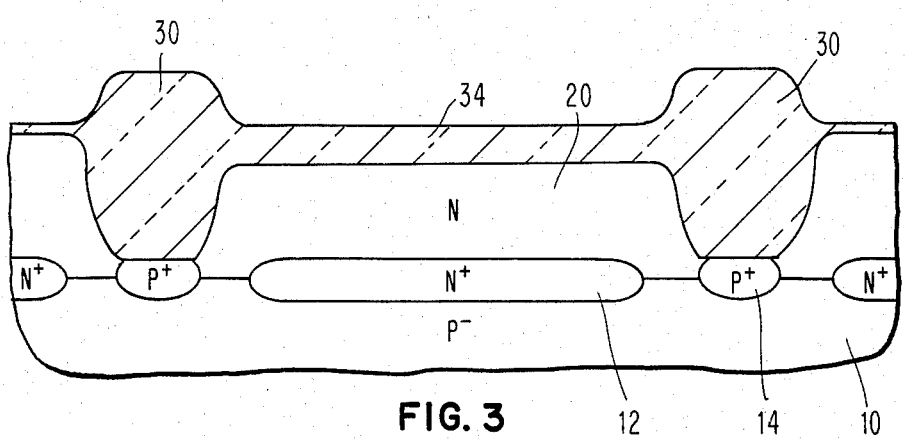

Referring now more particularly to FIGS. 1 through 3, the manufacturing steps for an NPN bipolar transistor utilizing the present method is described. FIG. 1 illustrates one small, greatly enlarged portion of a silicon body which will be used to form a very dense bipolar integrated circuit. A P− substrate of monocrystalline silicon 10 has a subcollector N+ diffusion 12 and P+ isolation diffusion 14 made therein. An epitaxial N layer 20 is then grown on top of the substrate. These processes are standard processes in the formation of, for example, NPN bipolar transistors. The substrate is typically a <100> crystallographic orientation silicon wafer having a resistance of the order of 1 to 20 ohm-cm. The subcollector diffusion is typically formed using arsenic having a surface concentration of about $10^{21}$ atoms/cm$^3$. The P diffusion is typically boron using a surface concentration of the order of $10^{20}$ atoms/cm$^3$. The epitaxial growth process to form layer 20 may be by conventional techniques, such as the use of SiCl$_4$/H$_2$ or SiH$_4$ gases at temperatures of about 1,000° C. to 1,200° C. During the epitaxial growth the dopant in the N+ layer moves into the epitaxial layer. The thickness of the epitaxial layer for highly dense integrated circuits is of the order of 3 micrometers or less.

The next series of steps form the masking pattern for the oxidation procedure which forms the pattern of recessed dielectric isolation. The mask structure is formed of layers of silicon dioxide 22, polycrystalline silicon 24 and silicon nitride 26 formed in that order upon the monocrystalline silicon body 10, 20. It is preferred that the silicon dioxide layer 22 is composed of a thermal silicon dioxide layer of between about 2 to 10 nanometers in thickness and preferably 3 to 5 nanometers in thickness. This silicon dioxide layer 22 is typically grown at a temperature of between about 700° to 900° C. in a dry oxygen ambient. The preferred temperature is 800° C. for this oxidation. The polycrystalline silicon layer has an operative thickness from between about 5 to 500 nanometers and a preferred thickness of between about 30 to 100 nanometers. The polycrystalline silicon is deposited by chemical vapor deposition or low pressure chemical vapor deposition at about 650° C. Reactants for this deposit are silane in a carrier gas such as hydrogen or nitrogen for chemical vapor deposition and silane alone for low pressure chemical vapor deposition. Alternatively, chlorinated silanes can be used at higher temperatures such as dichlorosilane at 750° C. or silicon tetrachloride at about 1000° C. It is preferred to use one of the silane (SiH$_4$) processes.

The silicon nitride layer 26 is typically a thickness of between about 10 to 500 nanometers and preferably between about 30 to 100 nanometers. It may be deposited by, for example, chemical vapor deposition or low pressure chemical vapor deposition in the temperature range of between about 700° to 1200° C. Reactants for this deposit are silicon tetrachloride and ammonia in a carrier gas such as hydrogen or nitrogen for chemical vapor depositions or dichlorosilane and ammonia either with or without a carrier gas such as nitrogen for low pressure chemical vapor deposition. Alternatively, SiH$_4$, SiClH$_3$, SiCl$_2$H$_2$, SiCl$_3$H, or SiCl$_4$ can be substituted for the silicon containing species in either reaction with an appropriate adjustment in the temperature of deposition.

The layers 22, 24 and 26 are now required to be patterned to form the mask pattern for the formation of the recessed oxide isolation. This patterning is done by conventional lithographic and etching techniques. A resist layer 28 is deposited over the top silicon nitride layer of the layered structure. The resist is exposed using conventional lithographic techniques and developed having the desired patterns of openings therein. The resist mask is then utilized to first etch the silicon nitride layer, then the polycrystalline silicon layer 24 and finally the silicon dioxide layer 22 down to the monocrystalline silicon epitaxial layer 20. Various etching materials and processes can be used for this etching process which include chemical, plasma or reactive ion etching. However, it is preferred to use reactive ion etching in a fluorinated gas such as CF$_4$. The system is preferably operated at a chamber pressure of 40 micrometers and a power density on the cathode of 0.25 watts/cm$^2$.

In this first embodiment of FIGS. 1 through 3 it is desired to form the semi-recessed oxide isolation structure, therefore the monocrystalline silicon layer 20 is not significantly etched in this process.

The result of this etching process is seen in FIG. 1. The resist layer 28 is then removed from the surface using an appropriate resist stripping solution such as sulfuric/nitric acid or oxygen ashing in a plasma reactor. The resulting structure is now subjected to an oxidizing treatment which is, for example, by heating the body to a temperature of about 1000° C. in a ramped furnace using a steam atmosphere. The result of this structure is given in FIG. 2 wherein the semi-recessed oxidation pattern 30 is shown. It is noted that the silicon dioxide pattern 30 extends above the top surface of the monocrystalline silicon epitaxial layer 20 in this semi-recessed oxide isolation structure. The "bird's beak" structure at 32 is much more limited than where prior masking structures are utilized. The bird's beak is a result of lateral oxidation which can occur through the silicon dioxide layer between the masking silicon nitride layer and monocrystalline silicon. The present process limits the diffusion of oxygen laterally by reducing the silicon oxide layer thickness and adding a polycrystalline silicon layer for stress relief. The thickness of the recessed oxide isolation is typically between 300 and 3,000 nanometers.

The silicon nitride layer 26 is now removed using, for example, a hot phosphoric acid dip etching solution. The polycrystalline silicon layer 24 can now either be removed by using chemical, plasma, or reactive ion etching techniques or it can be thermally oxidized to form a silicon dioxide layer 34 as is shown in the structure of FIG. 3. Alternatively, the polycrystalline silicon may be partially removed by etching and followed by the thermal oxidation of the remaining polycrystalline silicon to form a somewhat thinner layer than layer 34. The process now continues to manufacture by conventional techniques bipolar integrated circuits within the monocrystalline silicon epitaxial layer 20 surrounded by the pattern of dielectric isolation 30.

Figure 4:
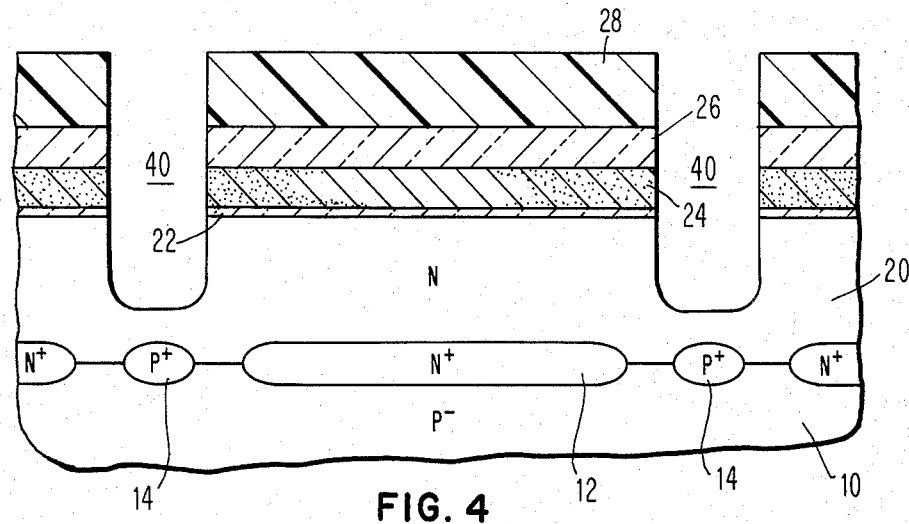
FIGS. 4 through 6 illustrate a second embodiment of the present invention where a full-recessed oxidation structure is formed.
Figure 5:
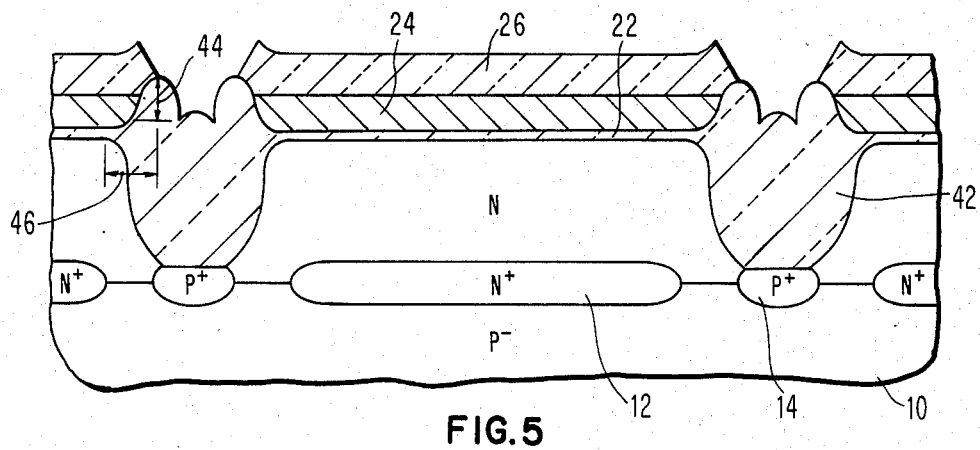
Figure 6:
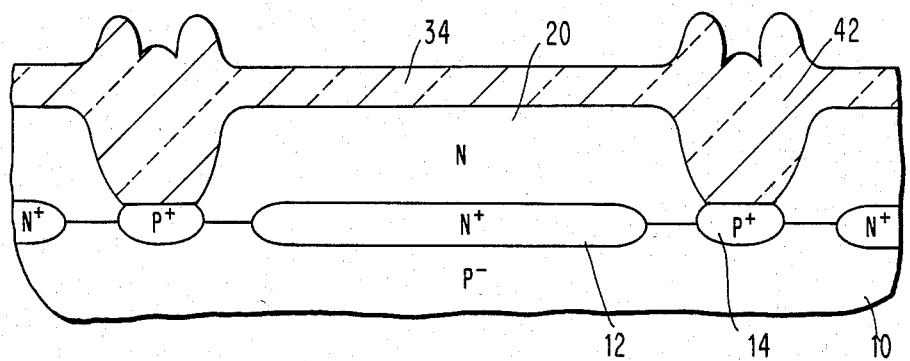

A second embodiment for manufacturing dielectric isolated bipolar integrated circuits is illustrated by FIGS. 4 through 6. In this case a full-recessed oxide isolation structure is formed. The identical process steps as described in conjunction with the first embodiment are followed through the etching of the masking pattern down to the monocrystalline silicon layer 20. In this instance it is required to etch a groove into the monocrystalline layer 20. The depth of the groove 40 is determined by the desired silicon dioxide isolation thickness to be grown and the desired planarity with the adjacent silicon structure. For a one micrometer silicon dioxide isolation to be planar with the adjacent silicon surface, the etch depth of the groove in the monocrystalline silicon would be 550 nanometers. The volume expansion of the silicon dioxide isolation is typically 55% of the total silicon dioxide thickness. The remaining 45% is the amount of monocrystalline silicon consumed by the oxidation. The monocrystalline silicon can be etched by using either chemical, plasma, or reactive ion etching techniques to form the groove. The preferred method is to continue the reactive ion etch in a fluorinated gas such as carbon tetrafluoride, $CF_4$, which is used to etch the silicon nitride layer 26, the polycrystalline silicon layer 24 and the silicon dioxide layer 22.

Typically the groove 40 does not extend all the way to the P+ region 14. Since the subsequent oxidation process will consume the silicon at the bottom of the groove in the formation of the silicon dioxide dielectric region down to the P+ region 14. The oxidation process as described in conjunction with the FIGS. 1 through 3 process results in the FIG. 5 structure in this full-recessed oxide isolation embodiment. The dielectric isolation region 42 extends down to the P+ region 14 to complete the isolation structure.

The bird's head or crest and beak structures are readily seen in this embodiment in FIG. 5. The head or crest height is indicated at 44 and the beak length is indicated at 46. The bird's head or crest is a result of the volume expansion which occurs during the oxidation of silicon. This volume expansion is in direct opposition to the movement of the growing oxide interface into the silicon. The volume expansion from the bottom is in an upward direction while the volume expansion from the sides are in a lateral direction. Both volume expansions are moving into the same space at the edge of the oxidation resulting in an upwelling of the oxide at the periphery of the oxide isolation region.

It should be noted that the beak length 46 is substantially less in this structure than in prior art structures and is without the problems of defects in the epitaxial layer 20 underneath the polycrystalline silicon.

The following examples are included merely to aid in the understanding of the invention and variations may be made by one skilled in the art without departing from the spirit and scope of the invention.

EXAMPLE 1

A recessed oxide isolation structure was formed on eight P− substrates using the process described in the description above. Four of these substrates contained a mask stack of 100 nm silicon nitride, 100 nm polycrystalline silicon and 10 nm silicon dioxide. The remaining four substrates contained a mask stack of 100 nm silicon nitride, 100 nm polycrystalline silicon but no underlying silicon dioxide layer. The recessed oxide isolation was formed to 1.0 um in thickness and planar with the monocrystalline silicon. After removal of the silicon nitride layer, the polycrystalline silicon layer was removed by a combination of chemical etching and thermal oxidation. The eight wafers were tested for defect density by removing all of the silicon dioxide layers in a buffered hydrofluoric solution and subjecting them to a defect delineating etch comprising acetic acid-nitric acid-hydrofluoric acid-chromium trioxide-potassium nitrate-in a aqueous solution. The four wafers which contained all three mask layers were found to have low defect densities of the order of $1 \times 10^{-5}$ defects/mil$^2$ whereas the four wafers which did not have a thin silicon dioxide between the polycrystalline and monocrystalline silicon were found to have an average of 2 defects/mil$^2$ in the monocrystalline silicon areas. The defect level of 2 defects/mil$^2$ is completely unsatisfactory.

EXAMPLE 2

A recessed oxide isolation-metal semiconductor diode test structure was used to study the silicon nitride/polycrystalline silicon/silicon dioxide mask structure. This simple two-level test structure has recessed oxide isolation which define diodes with 100 mil$^2$ device areas. Monocrystalline silicon wafers of a <100> crystallographic orientation and 10-20 ohm/cm P− material had deposited thereon layers of 3 to 6 nanometers of silicon dioxide, 50 to 150 nanometers polycrystalline silicon and 50 to 150 nanometers silicon nitride. The diodes were patterned and the silicon recessed with carbon tetrafluoride reactive ion etching. The 1 micron thick full-recessed oxide isolation film was grown at 1000° C. in a ramped oxidizing furnace wherein the ambient was steam $+O_2$. The silicon dioxide layer was formed at 800° C. in a dry $O_2$ environment, a low pressure chemical vapor deposited (LPCVD) polycrystalline silicon layer was formed using silane as the reactant at 650° C., and the silicon nitride was deposited by LPCVD using $SiH_2Cl_2$ and $NH_3$ as the reactants at a temperature of 900° C.

The silicon nitride layer was then removed using hot phosphoric acid. A 160 nanometer thermal oxidation was made to completely oxidize the polycrystalline silicon layer. An arsenic ion implant of $8 \times 10^{15}$ cm$^{-2}$ at 80 KeV followed by a nitrogen anneal at 1000° C. for 120 minutes resulted in a 0.5 micrometer junction depth of the N region. An aluminum evaporation and subetch were done to define contacts for the diodes.

Figure 7:
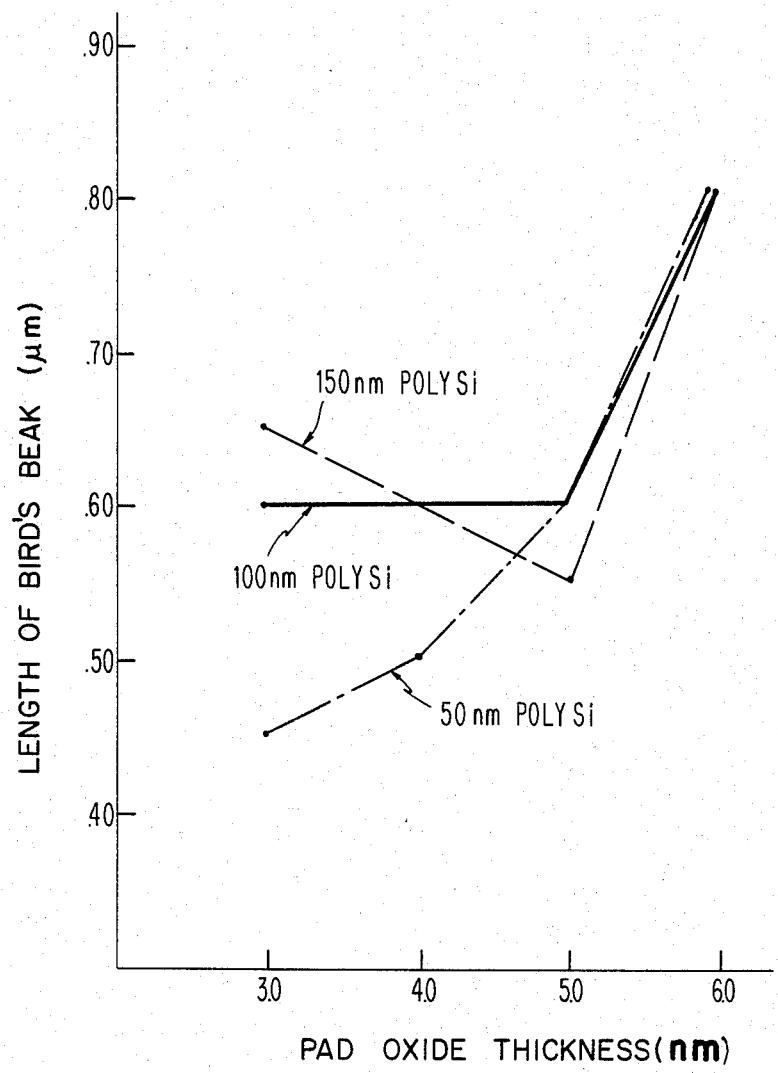
FIG. 7 is a graphical representation illustrating beak length versus silicon dioxide layer thickness for silicon nitride/polycrystalline silicon/silicon dioxide recessed oxide isolation mask.

The bird's beak measurement results were obtained on microphotographs taken on a scanning electron microscope. The beak length was measured from the edge of the silicon nitride film to the tip of the beak as illustrated in FIG. 5. The crest height was measured from the top of the crest to the mask-substrate interface as also is illustrated in FIG. 5. FIG. 7 shows the beak length as a function of silicon dioxide layer thickness for several polycrystalline silicon thicknesses. The data shown is from wafers with 100 nanometers of silicon nitride. The results from wafers with 200 nanometers of silicon nitride were not significantly different and are therefore not illustrated. The beak length appears to be relatively insensitive to silicon dioxide thicknesses in the range of 3 to 5 nanometers. These measurements show that the silicon nitride/polycrystalline silicon/silicon dioxide mask substantially reduces the bird's beak from the prior processes which uses silicon nitride over silicon dioxide as a mask. When silicon dioxide films of 5 nanometers or less are used, the bird's beak is approximately 0.5 micrometers long. In comparison, wafers with 100 nanometers silicon nitride/160 nanometers silicon dioxide masks had beaks of which were 1.4 micrometers long. This reduction in beak size allows the size of an isolation region to be reduced by about 1.8 micrometers, thus, significantly improving the device density.

Figure 8:
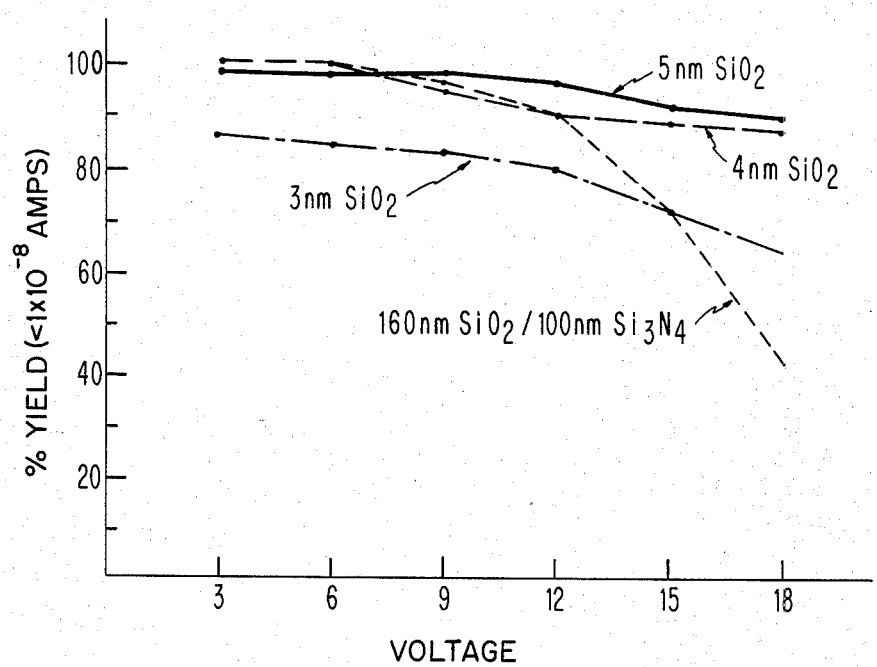
FIGS. 8 and 9 are graphical representations indicating the percentage of silicon diodes/wafers with less than $1 \times 10^{-8}$ amps of leakage at several voltages.
Figure 9:
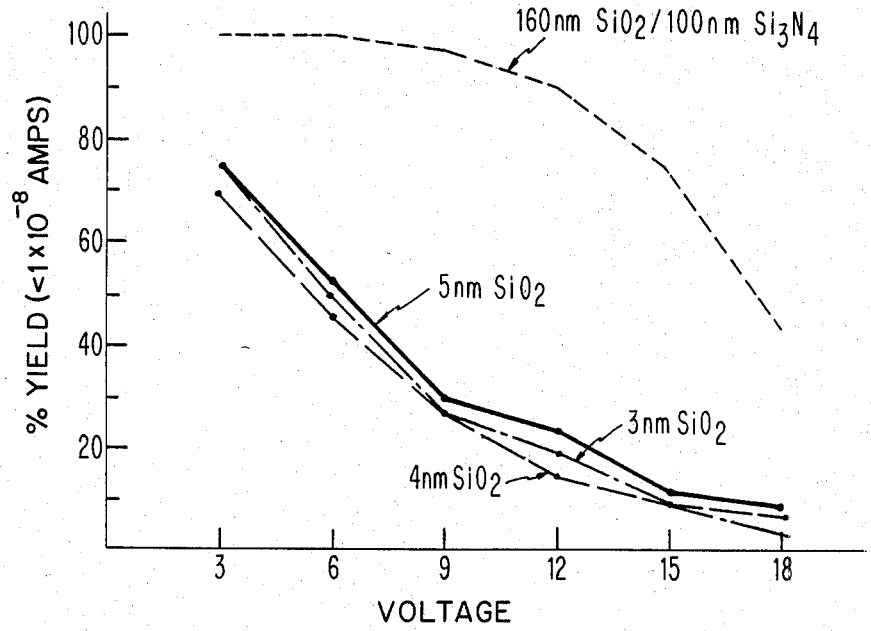

The recessed oxide isolation reverse bias diode leakage measurements show low level current leakage in the range of 3 volts to 18 volts in increments of 3 volts as shown in FIGS. 8 and 9. Thirty diodes of 100 mil$^2$ area were tested on each wafer. A computer program was used to reduce the results into the percentage of diodes tested which fall into specific ranges of leakage current for each voltage. FIGS. 8 and 9 show plots of percentage yields versus voltage for silicon nitride/polycrystaline silicon/silicon dioxide and control wafers using a mask of silicon nitride/silicon dioxide. The silicon nitride/polycrystalline silicon/silicon dioxide wafers in FIG. 8 had recessed oxide isolation masks with 50 nanometers silicon nitride, 50 nanometers of polycrystalline silicon and 3, 4 and 5 nanometers of silicon dioxide. The dashed line represents the control wafer which had 100 nanometers of silicon nitride and 160 nanometers of silicon dioxide for the recessed oxide isolation mask. The samples with 3 nanometers of silicon dioxide show a decrease in yield possibly because the thin silicon dioxide is not fully preventing epitaxial regrowth of the polycrystalline silicon layer. FIG. 9 shows the results for similar silicon nitride/polycrystalline silicon/silicon dioxide wafers with a 100 nanometer silicon nitride layer. The lower yield for wafers with 100 nanometers thickness of silicon nitride is probably due to the inability of the 50 nanometer polycrystalline silicon layer to buffer the increased silicon nitride stress. The results show that there is little or no difference in the amount of leakage seen on the wafers which had the control masks and those with 50 nanometers silicon nitride/50 nanometers polycrystalline silicon/4 or 5 nanometers silicon dioxide mask.

While the invention has been particularly shown and described with reference to the preferred bipolar transistor integrated circuit embodiments thereof, it will be understood by those skilled in the art that various changes in form and detail may be made therein without departing from the spirit and scope of the invention. For example, field effect transistors and other devices may be utilized rather than bipolar transistor devices within the isolated patterns of monocrystalline silicon. In these cases it may not be necessary, particularly with field effect transistors, to have the buried regions of N+ and P+ within the body of the monocrystalline silicon. Further, it may not be necessary to have an epitaxial layer over the substrate to form integrated circuit devices therein. It is of course obvious that while an NPN type of bipolar integrated circuits is envisioned in the first and second embodiments, that the process is not limited to NPN transistors but can be changed for forming PNP type transistors by simply changing the impurities in each of these regions to an impurity of an opposite type.

What is claimed is:

1. A method for manufacturing a monolithic integrated circuit structure comprising:
   providing a monocrystalline silicon semiconductor body;
   depositing onto said monocrystalline semiconductor body layers of silicon dioxide, polycrystalline silicon, and silicon nitride in that order;
   said silicon dioxide layer is between about 2 to 10 nanometers in thickness;
   patterning the said layers to form openings at the areas wherein it is desired to form an oxide isolation pattern within the said monocrystalline semiconductor body;
   oxidizing said body at the same openings until the desired oxide isolation pattern penetrates to the desired depth within the semiconductor body; and
   removing the remaining pattern of said layers following said oxidizing of said body before forming semiconductor devices in said body and between said oxide isolation pattern.

2. The method of claim 1 wherein said patterning includes etching into said monocrystalline body prior to said oxidizing said body so as to produce a substantially planar top surface of said isolation pattern with said body.

3. The method of claim 1 wherein said patterning stops at the surface of said body.

4. The method of claim 1 wherein said silicon dioxide layer is grown by thermal oxidation.

5. The method of claim 1 wherein the said silicon dioxide layer is between about 2 to 5 nanometers in thickness.

6. The method of claim 1 wherein said silicon dioxide is formed by exposing said body to a dry oxygen ambient at between about 700° to 900° C.

7. The method of claim 1 wherein said polycrystalline silicon and silicon nitride layers each are between about 5 to 500 nanometers and are deposited by chemical vapor deposition.

8. The method of claim 7 wherein said chemical vapor deposition is a low pressure vapor deposition.

9. The method of claim 1 wherein said desired oxide isolation pattern is between about 300 to 3,000 nanometers in thickness.

* * * * *